(12) United States Patent
Briggs et al.

(10) Patent No.: US 10,395,978 B2
(45) Date of Patent: Aug. 27, 2019

(54) METHOD OF PATTERNING TARGET LAYER

(71) Applicant: IMEC VZW, Leuven (BE)

(72) Inventors: Basoene Briggs, Heverlee (BE); Farid Sebaai, Schaerbeek (BE); Juergen Boemmels, Heverlee (BE); Zsolt Tokei, Leuven (BE); Christopher Wilson, Tervuren (BE); Katia Devriendt, Binkom (BE)

(73) Assignee: IMEC vzw, Leuven (BE)

( * ) Notice: Subject to any disclaimer, the term of this patent is extended or adjusted under 35 U.S.C. 154(b) by 0 days.

(21) Appl. No.: 15/907,118

(22) Filed: Feb. 27, 2018

(65) Prior Publication Data
US 2018/0247863 A1 Aug. 30, 2018

(30) Foreign Application Priority Data

Feb. 27, 2017 (EP) .................................. 17158197

(51) Int. Cl.
*H01L 21/033* (2006.01)
*H01L 21/768* (2006.01)
(Continued)

(52) U.S. Cl.
CPC .... *H01L 21/76816* (2013.01); *H01L 21/0337* (2013.01); *H01L 21/3086* (2013.01); *H01L 21/31144* (2013.01); *H01L 21/32139* (2013.01)

(58) Field of Classification Search
CPC ......... H01L 2924/00; H01L 2924/0002; H01L 29/66545; H01L 29/785; H01L 29/66795;
(Continued)

(56) References Cited

U.S. PATENT DOCUMENTS 7,887,996 B2 * 2/2011 Liu ..................... H01L 21/0334
430/270.1
8,900,467 B1 * 12/2014 Chapuis ................ G03F 7/0002
216/41
(Continued)

*Primary Examiner* — Jaehwan Oh
(74) *Attorney, Agent, or Firm* — Knobbe, Martens, Olson & Bear LLP

(57) ABSTRACT

The disclosed technology generally relates to semiconductor processing, and more particularly to patterning a target layer using a sacrificial structure. According to an aspect of the disclosed technology, a method of patterning a target layer comprises forming on the target layer a plurality of parallel material lines spaced apart such that longitudinal gaps exposing the target layer are formed between the material lines. The method additionally includes filling the gaps with a sacrificial material and forming a hole by removing the sacrificial material along a portion of one of the gaps, where the hole extends across the gap. The hole exposes the target layer in the gap. The method additionally includes filling the hole with a fill material to form a block portion extending across the gap. The method additionally includes removing, selectively to the material lines and the block portion, the sacrificial material from the target layer to expose the gaps, where the one of the gaps is interrupted in the longitudinal direction by the block portion. The method further includes transferring a pattern including the material lines and the block portion into the target layer.

18 Claims, 6 Drawing Sheets

(51) Int. Cl.
*H01L 21/3213* (2006.01)
*H01L 21/311* (2006.01)
*H01L 21/308* (2006.01)

(58) Field of Classification Search
CPC ........... H01L 29/0649; H01L 29/42392; H01L 21/823431
See application file for complete search history.

(56) References Cited

U.S. PATENT DOCUMENTS

| | | | | |
|---|---|---|---|---|
| 8,986,554 | B2* | 3/2015 | Kim | H01L 21/308 216/17 |
| 9,034,197 | B2* | 5/2015 | Lille | G11B 5/855 216/41 |
| 9,570,680 | B2* | 2/2017 | Kim | H01L 21/76816 |
| 9,793,137 | B2* | 10/2017 | Somervell | G03F 7/0002 |
| 2007/0224823 | A1* | 9/2007 | Sandhu | H01L 21/0332 438/694 |
| 2010/0159214 | A1* | 6/2010 | Hasegawa | B81C 1/00031 428/195.1 |
| 2010/0227276 | A1* | 9/2010 | Mizuno | C23C 16/402 430/312 |
| 2011/0147985 | A1* | 6/2011 | Cheng | G03F 7/0392 264/225 |
| 2013/0183827 | A1* | 7/2013 | Millward | H01L 21/0273 438/694 |
| 2013/0189504 | A1* | 7/2013 | Nealey | B82Y 30/00 428/201 |
| 2013/0273330 | A1* | 10/2013 | Wang | B81C 1/0038 428/172 |
| 2013/0344249 | A1* | 12/2013 | Minegishi | C08L 25/06 427/271 |
| 2014/0061154 | A1* | 3/2014 | Kim | G03F 7/0035 216/49 |
| 2014/0065839 | A1* | 3/2014 | Kawanishi | H01L 21/0271 438/761 |
| 2014/0116980 | A1* | 5/2014 | Wuister | G03F 7/0002 216/11 |
| 2014/0127910 | A1* | 5/2014 | Hieno | H01L 21/3081 438/703 |
| 2014/0154630 | A1* | 6/2014 | Schmid | G03F 7/0002 430/323 |
| 2015/0111387 | A1* | 4/2015 | Somervell | G03F 7/42 438/703 |

* cited by examiner

METHOD OF PATTERNING TARGET LAYER

CROSS-REFERENCE TO RELATED APPLICATIONS

This application claims foreign priority to European Patent Application No. EP 17158197.9, filed Feb. 27, 2017, the content of which is incorporated by reference herein in its entirety.

BACKGROUND

Field

The disclosed technology generally relates to semiconductor processing, and more particularly to patterning a target layer using a sacrificial structure.

Description of the Related Technology

In fabricating integrated circuit (IC) devices, various intermediate structures and patterns are formed, including lines and/or trenches. The lines and/or trenches may be formed in a sacrificial layer, e.g., a hard mask layer, or in a target layer. For instance, the lines and/or trenches may be used to form electrical interconnection structures for interconnecting semiconductor devices in the IC devices.

An interconnection structure may include one or more metallization levels or tiers, that are formed over or above the substrate in which semiconductor devices, e.g., transistors, may be formed. A metallization level includes conductive paths, which may include conductive lines and/or vias that are arranged in a dielectric material layer, which may be referred to as an intermetal dielectric (IMD) or an interlayer dielectric (ILD) layer. A metallization level may be formed by forming a pattern of conductive lines in the dielectric layer. For example, a mask layer arranged on the dielectric layer may be patterned using lithography and etch processes. The pattern of the mask layer may subsequently be transferred into the dielectric layer by etching. For forming some sub-lithographic structures, or structures smaller than the lithographic wavelength, multiple patterning sequences, such as multiple lithography and etch sequences, may be employed. Such sequences may be performed to decrease a pitch of lines/trenches, or to increase the density of lines/trenches. Example multiple patterning sequences including pitch splitting techniques such as self-aligned double patterning (SADP), quadruple patterning (SAQP) or pitch multiplication processes, may be used to enable patterns with sub-lithographic critical dimensions.

For fabricating some structures, interrupted or discontinuous lines are employed. However, prior art techniques such as direct printing or block techniques may be technically and/or financially challenging for aggressive scaling due to associated complex process sequences and/or etching or lithography layer stacks. Thus, there is a need for improved fabricating method for fabricating discontinuous lines and/or spaces.

SUMMARY OF CERTAIN INVENTIVE ASPECTS

An objective of the disclosed technology is to provide an improved method of patterning a target layer. Further and alternative objectives may be understood from the following.

According to an aspect of the disclosed technology there is provided a method of patterning a target layer, the method comprising: forming on the target layer a plurality of parallel material lines spaced apart such that longitudinal gaps exposing the target layer are formed between the material lines, filling the gaps with a sacrificial material, forming a hole by removing the sacrificial material along a portion of one of the gaps, the hole extending across the gap and exposing the target layer in the gap, filling the hole with a fill material to form a block portion extending across the gap, removing, selectively to the material lines and the block portion, the sacrificial material from the target layer to expose the gaps, the one gap being interrupted in the longitudinal direction by the block portion, and transferring a pattern including the material lines and the block portion into the target layer.

By the disclosed method, the target layer may be patterned to include trenches, at least one of which is interrupted to form a discontinuous trench.

The trench interruption is enabled by the block portion which may be formed without requiring any complex material stack for material deposition or complexing etching sequence.

The present method may be advantageously applied for the purpose of forming trenches for conductive lines in a dielectric layer. The target layer may accordingly form a mask layer arranged on a dielectric layer (in which the conductive lines are to be formed).

By the hole extending across the gap, the hole exposes side walls of material lines on opposite sides of the gap. More specifically, the hole may expose a side wall of a first material line and a side wall of a second material line, the first and second material lines being arranged on opposite sides of the gap. The block portion may hence conveniently and reliably be formed to fully bridge the gap by filling the hole with the fill material.

The block portion may be formed within an intended gap even if the hole is formed to overlap the material lines on opposite sides of the intended gap. This allows a degree of relaxation of the alignment requirements of the hole with respect to the material lines and the gap.

By "patterning" of a target layer is hereby meant the definition of a pattern above the target layer, and a transfer of the pattern into the target layer.

The transfer of the pattern into the target layer may include etching the target layer using the material lines and the block portion as an etch mask.

By a first feature such as a layer, a level or other element, being formed "on" a second feature such as a layer, a level or other element, is hereby meant that the first feature is formed directly on the second feature, i.e., in abutment with the second feature, or with one or more layers intermediate the first and the second feature, i.e., not in direct contact with the second feature.

By a second feature such as a layer, a level or other element, being formed "above" a first feature such as a layer, a level or other element, is hereby meant that the second feature is formed above the first feature along (or as seen) in a stacking direction of the features forming part of the overall structure. This direction may equivalently be defined as a normal direction to (a main surface of) the target layer, or a normal direction to a substrate supporting the features or layers. The stacking direction may also be referred to as a "vertical" direction. A "horizontal" direction may be used to refer to a direction parallel to a main plane of extension, or a main surface, of the target layer or of the substrate.

By "metallization level" is hereby meant a structure including conductive paths arranged in a dielectric layer. The conductive paths may include conductive lines extending in a horizontal direction in the dielectric layer. The conductive paths may include conductive vias extending vertically through the dielectric layer.

By a "trench" in a layer (e.g., in the target layer or in the dielectric layer) is hereby meant a recess in the layer. Advantageously, a trench may, at least along a portion thereof, extend in a straight line and presents a uniform width.

The material lines may formed as a set or parallel and regularly spaced material lines. The gaps may present a regular width and spacing. The material lines may also be referred to as cores or mandrels.

According to one embodiment, filling the gaps with the sacrificial material includes forming a sacrificial material layer filling the gaps and covering the material lines. The gaps may hence be reliably filled with sacrificial material by forming of a single material layer.

The sacrificial material layer may include an upper thickness portion arranged above the material lines and a lower thickness portion arranged within the gaps, wherein the hole includes an upper hole portion extending through the upper thickness portion and a lower hole portion extending through the lower thickness portion. By forming the hole to extend through the upper and lower thickness portions, a mouth of the hole may be arranged at a level above the top surface of the material lines. The upper thickness portion of the sacrificial material layer may protect the material lines from being exposed from possibly adverse process steps preceding the removal of the sacrificial material.

Alternatively, the method may further comprise reducing a thickness of the sacrificial material layer to expose a top surface of the material lines, prior to forming the hole. An upper thickness portion of the sacrificial material layer arranged above the material lines may thus be removed prior to the forming of the hole. This may simplify alignment of the hole with the intended gap.

According to one embodiment, filling the hole with the fill material includes forming a fill material layer filling the hole and covering the sacrificial material. The hole may hence be reliably filled with sacrificial material by forming of a single material layer. This also allows filling of a plurality of holes, if such have been formed, in a common process step.

The fill material layer may include an upper thickness portion arranged above a mouth of the hole and a lower thickness portion arranged within the hole, wherein the method may further comprise reducing a thickness of the fill material layer to remove the upper thickness portion. The hole mouth and sacrificial material layer may thereby be exposed. Moreover, the thickness reduction enables removal of fill material outside the hole (or holes if plural holes have been formed), such that the fill material only remains in the hole(s).

According to one embodiment, the method further comprises forming at least a second hole by removing the sacrificial material along a portion of a second one of the gaps, the second hole extending across the second gap and exposing the target layer in the second gap. Hence two or more holes may be formed, enabling forming of two or more block portions and, accordingly, forming of two or more interrupted trenches in the target layer.

The method may further comprise forming a fill material layer filling the (first) hole and the second hole and covering the sacrificial material, wherein the (first) block portion is formed in the (first) hole and a second block portion is formed in the second hole. Two or more holes may thereby be reliably filled in a common process step.

By the fill material layer covering the sacrificial material, the fill material layer may accordingly include an upper thickness portion arranged above a mouth of each of the (first) hole and the second hole, and a lower thickness portion arranged within the (first) hole and the second hole.

The method may further comprise reducing a thickness of the fill material layer to remove the upper thickness portion, wherein the (first) block portion and the second block portion form discrete block portions. The first and second block portions are discrete in the sense that they become disconnected sacrificial material portions, confined to the respective holes.

By removing the upper thickness portion, the sacrificial material previously covered by the upper thickness portion of the fill material layer may be exposed, enabling the subsequent removal of the sacrificial material.

According to one embodiment the method further comprises, subsequent to removing the sacrificial material and prior to transferring a pattern into the target layer: forming a conformal layer covering the target layer, the material lines and the block portion, and etching the conformal layer anisotropically such that the target layer is exposed in the gaps and portions of the conformal layer remain on side walls of the material lines and the block portion (and the second block portion if present).

This allows critical dimensions of the material lines and the block portion(s) to be restored, in the event that one or more process steps, in particular the act of removal of the sacrificial layer, have resulted in loss of material from the material lines or the block portion(s).

By an "anisotropic" etch is hereby meant an etch process etching preferentially, i.e., having an etch rate which is greater, along a main direction. To expose the target layer in the gaps and leave portions of the conformal layer on the side walls, the etching may be performed mainly (i.e., the direction of greater etch rate may be oriented) along a vertical direction.

According to one embodiment the target layer forms a mask layer arranged on a dielectric layer wherein the method further comprises transferring a pattern of the mask layer into the dielectric layer. The set of trenches, including one or more interrupted trenches, may accordingly be transferred into the dielectric layer. The dielectric layer may be a dielectric layer of a metallization level which is to be formed.

The set of trenches in the dielectric layer may subsequently be filled with a conductive material to form conductive lines in the dielectric layer. The one or more interrupted trenches allow forming of one or more interrupted conductive line.

The trenches may be at least partially filled with a conductive material. The conductive material may be a single metal or a mixture or alloy of metals or of a metal and another material. A complete filling of the trenches is advantageous since it allows the entire cross-sectional area, allowed by the trenches in the dielectric layer, to be filled by the conductive material to obtain a low-resistance interconnect structure.

The act of filing with a conductive material may comprise forming the conductive material also above the dielectric layer and removing the conductive material in locations outside of the trenches of the dielectric layer. The removing of excess conductive material may divide the deposited conductor into separate paths extending within the trenches of the dielectric layer.

The act of filing with a conductive material may be performed subsequent to removing the mask layer from the dielectric layer.

The sacrificial material may be different from the fill material and a material of the material lines. This enables a selective removal of the sacrificial material from the gaps between the material lines.

By removal of a material "A", selectively to a material "B", is hereby meant that a feature of material A arranged adjacent to a feature of material B may be removed while preserving the feature of material B. This may be achieved by selecting material "A" and material "B" as a combination of materials presenting different etch rates in a given etch process. The preservation of the feature of material B following the etch process may be complete (in the sense that the feature of material B not is affected appreciably during the etch process) or at least partial (in the sense that the feature of material B remains at least to the extent that it may serve its intended function during subsequent process steps).

Accordingly, removing, selective to the material lines and the block portion, the sacrificial material from the target layer may include etching the sacrificial material at a greater rate than the material lines and the block portion (such that the gaps are exposed).

A material of the material lines and the fill material may be the same. Hence, the pattern including the material lines and the block portion(s) may be formed by a homogenous material. This may improve the fidelity and consistency of the pattern transfer into the mask layer.

A material of the target layer may be different from a material of the material lines.

The target layer may be any layer or layer stack having the ability to withstand, and accordingly remain at least partially following the process for forming the material lines and the removal of the sacrificial layer.

In addition, a target layer forming a mask layer arranged on a dielectric layer may be any layer or layer stack having the ability to withstand, and accordingly remain at least partially following, a transfer of the pattern of the mask layer into the dielectric layer.

The mask layer may advantageously be a non-resist based mask layer. The mask layer may advantageously be a "hard" mask layer. The mask layer may include titanium nitride, titanium oxide, hafnium oxide or zirconium oxide. The mask layer may also be a layer stack including sub-layers of the materials.

BRIEF DESCRIPTION OF THE DRAWINGS

The above, as well as additional objects, features and advantages of the disclosed technology, will be better understood through the following illustrative and non-limiting detailed description, with reference to the appended drawings. In the drawings like reference numerals will be used for like elements unless stated otherwise.

DETAILED DESCRIPTION OF CERTAIN ILLUSTRATIVE EMBODIMENTS

A method of patterning a target layer will now be described with reference to FIGS. 1a-1h.

Figure 1A:
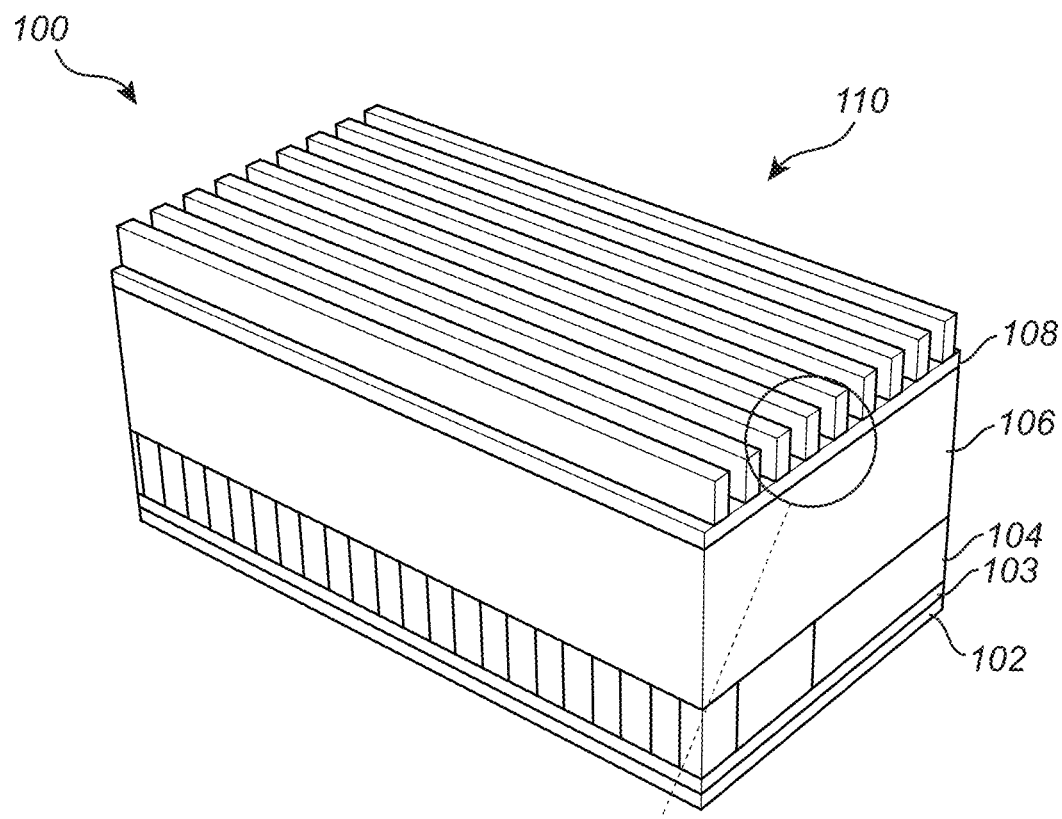
FIGS. 1a-1h schematically illustrate intermediate structures at various stages of a method of patterning a mask layer.
Figure 1B:
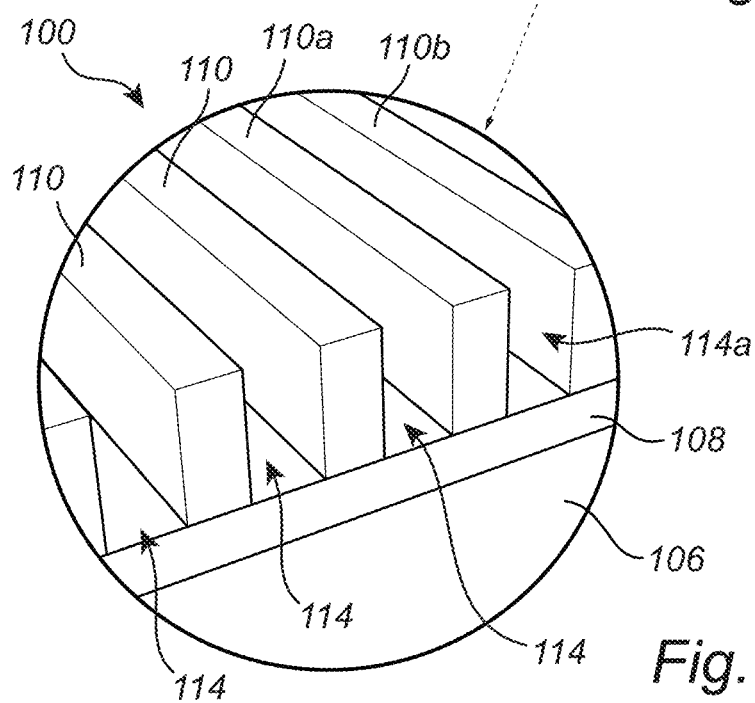

The method comprises forming on a target layer 108 a plurality of parallel material lines 110 spaced apart such that longitudinal gaps 114 exposing the target layer 108 are formed between the material lines 110 (FIGS. 1a, 1b).

Figure 1C:
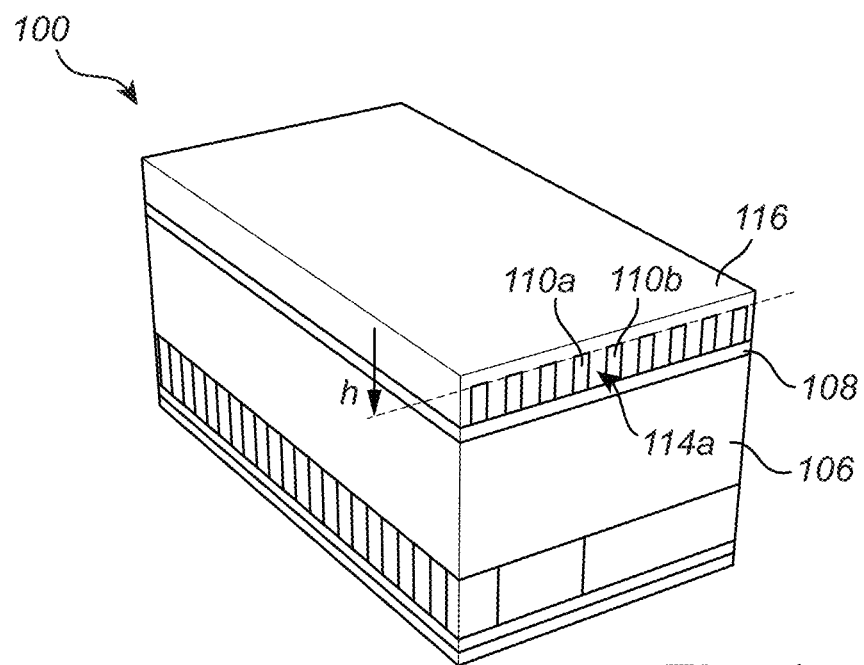

The method comprises filling the gaps 114 with a sacrificial material 116 (FIG. 1c).

Figure 1D:
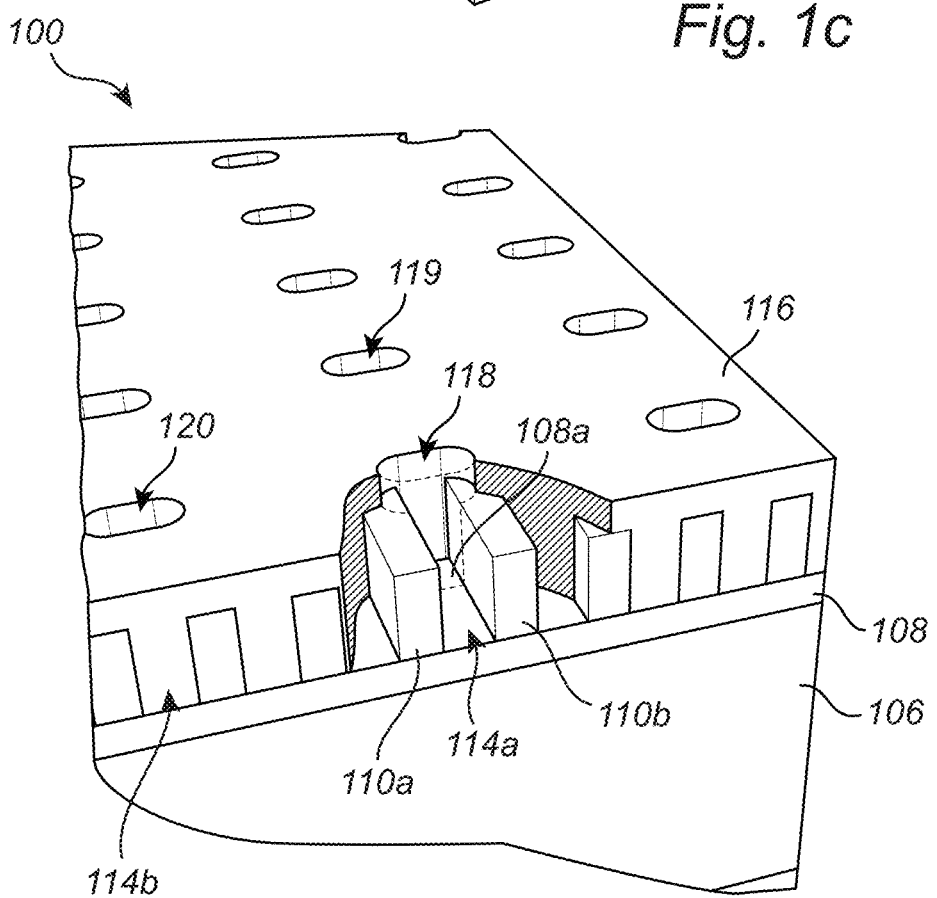

The method comprises forming a hole 118 by removing the sacrificial material 116 along a portion of one gap 114a of the gaps 114, the hole 118 extending across the gap 114a and exposing the target layer 108 in the gap 114a (FIG. 1d).

Figure 1E:
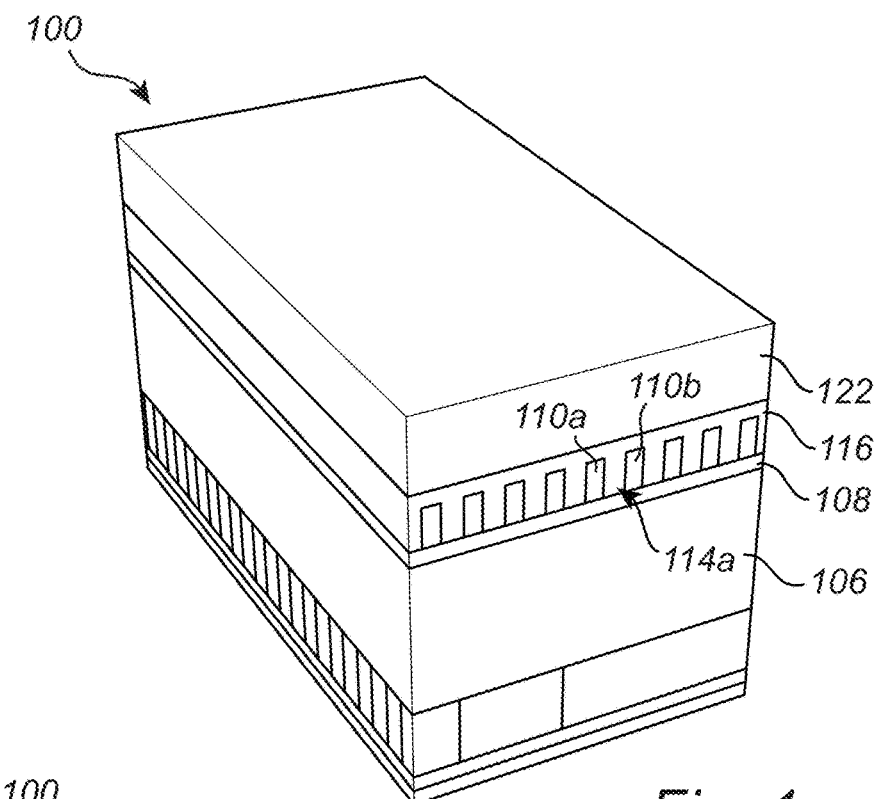
Figure 1F:
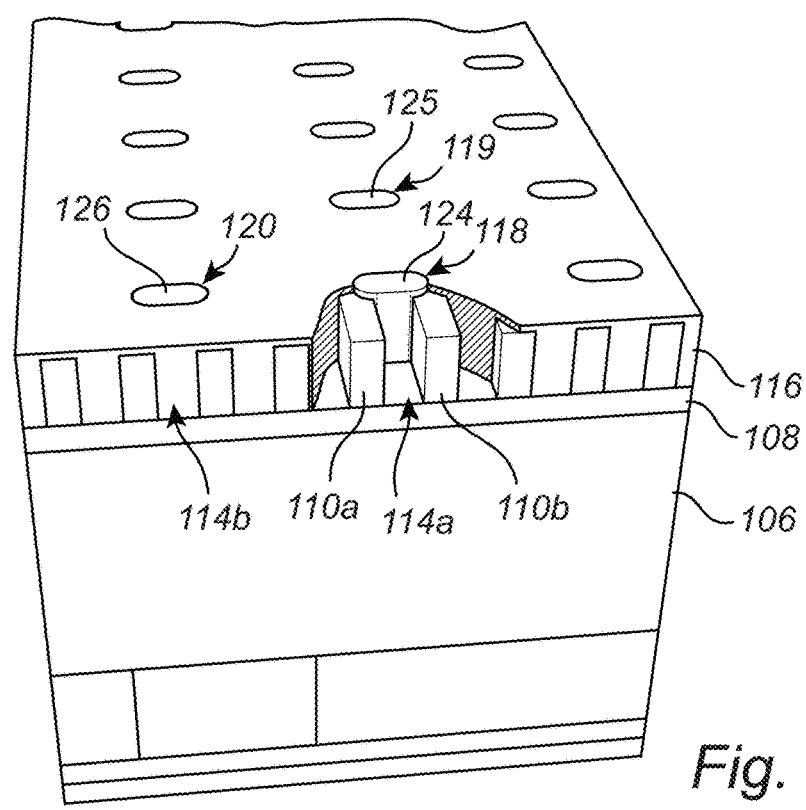

The method comprises filling the hole 118 with a fill material 122 to form a block portion 124 extending across the gap 114a (FIGS. 1e,1f).

Figure 1G:
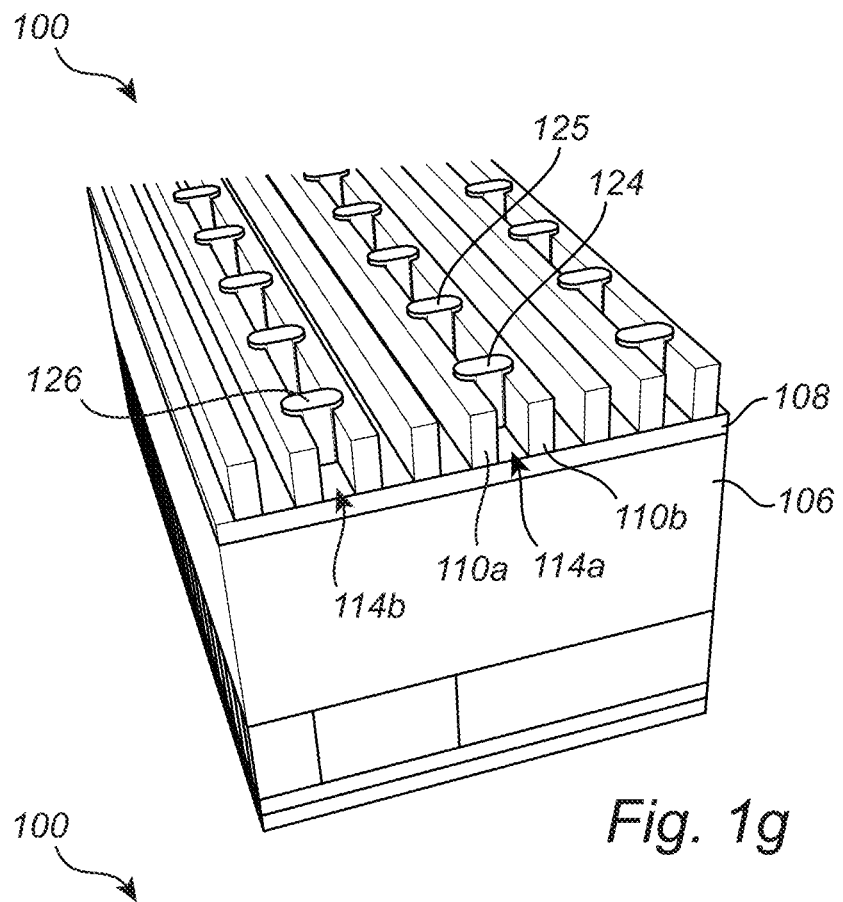

The method comprises removing, selectively to the material lines 110 and the block portion 124, the sacrificial material 116 from the target layer 108 to expose the gaps 114, the one gap 114a being interrupted in the longitudinal direction by the block portion 124 (FIG. 1g).

Figure 1H:
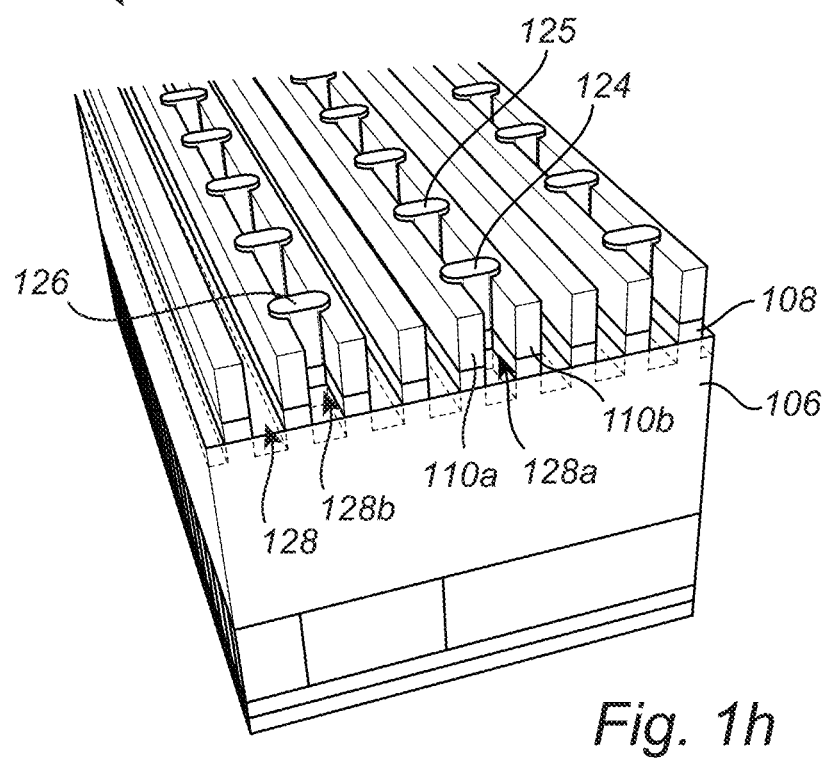

The method comprises transferring a pattern including the material lines 110 and the block portion 124 into the target layer 108 (FIG. 1h).

The method will be described in connection with forming conductive lines of a metallization level of a semiconductor structure, wherein the target layer forms a mask layer 108, arranged on a dielectric layer 106. In particular, the method enables forming trench interruptions or blocks in advanced semiconductor manufacturing. It is, however, noted that embodiments are not limited to forming conductive lines, and the method has a more general applicability for forming conductive or insulating lines and/or trenches, including interrupted lines and/or trenches, in a target layer.

With reference to FIG. 1a there is shown, in perspective, a section of an intermediate semiconductor structure or intermediate device 100. The structure 100 may extend laterally or horizontally beyond the illustrated section. The illustrated planes of section extending through the structure 100 are common to all the figures.

It is noted that the relative dimensions of the shown elements, in particular the relative thickness of the layers, is merely schematic and may, for the purpose of illustrational clarity, differ from a physical structure.

The structure 100 includes in a bottom-up direction a semiconductor substrate 102. The substrate 102 may include, e.g., a silicon substrate or a compound semiconductor substrate, including silicon-on-insulator (SOI). An active device layer 103 formed on the substrate 102 may include various semiconductor devices such as transistors, diodes or resistors to name a few, that are fabricated on a main surface of the substrate 102. The active device layer 103 may also be referred to as a front-end-of-line portion (FEOL-portion 103). In FIG. 1a, a first metallization level 104, including conductive lines arranged in a dielectric layer, is formed above the FEOL-portion 103.

The structure 100 includes a dielectric layer 106. In the illustrated embodiment, the dielectric layer 106 forms a dielectric layer of the metallization level which is to be formed. The dielectric layer 106 may include a silicon oxide layer, for instance $SiO_2$, or a low-K dielectric material, e.g., carbon-doped and/or porous $SiO_2$. Although not shown in FIG. 1a, the dielectric layer 106 may include a stack of layers of different dielectric materials, such as an interface layer and/or an oxide capping layer.

A target layer in the form of a mask layer 108 is formed on the dielectric layer 106. The mask layer 108 covers an upper surface of the dielectric layer 106. In some embodiments, the mask layer 108 may serve as a mask layer, e.g., a hard mask layer, for patterning the dielectric layer 106. The mask layer 108 may be formed of a suitable material that may be relatively etch-selective relative to the dielectric layer 108, e.g., a layer of titanium nitride, titanium oxide, hafnium oxide, zirconium oxide or a ruthenium or aluminum alloy. In some other embodiments, the mask layer 108 may comprise a stack of one or more sub-layers formed of any of these materials. In some other embodiments, the mask layer 108 may be formed of or include as one or more sub-layers SiCN, amorphous carbon (a-C) or amorphous silicon (a-Si). The mask layer 108, or the sub-layers thereof, may be formed by a suitable process including, e.g., atomic layer deposition (ALD), chemical vapor deposition (CVD) or physical vapor deposition (PVD).

Still referring to FIGS. 1a and 1b, a grating comprising a plurality of material lines 110 is formed on the mask layer 108. In some embodiments, the material lines 110 may be formed of or comprise SiN. The material lines 110 may also be formed of or comprise one or more of a-C, a-Si, spin-on-carbon (SOC), SiCN, a photoresist or an oxide, to name a few. According to embodiments, the material lines 110 and of mask layer 108 are formed of different materials, to allow etching of the mask layer 108 using the material lines 110 as an etch mask as will be further described below. The material lines 110 are elongated and extend in parallel to each other. The material lines 110 are regularly spaced apart such that longitudinal gaps 114 are formed between the material lines 110. The gaps 114 present a regular width and spacing. The plurality of material lines 110 may also be referred to as a grating layer 110.

FIG. 1b is an enlarged view of the structure 100, showing an enlarged view of the material lines 110 and gaps 114. The material lines 110a and 110b represent, respectively, a first material line 110a and an adjacent second material line 110b. The first material line 110a and the second material line 110b are separated by a gap 114a. Each material line 110 presents, as shown, a pair of opposite side walls and a top surface.

Forming of the plurality of material lines 110 may including forming a line material layer on the mask layer 108. The line material layer may be formed by any of the above-mentioned materials. The line material layer may be deposited using a deposition process suitable for the selected material. Examples of deposition processes include CVD, PVD, ALD and spin-coating. The plurality of material lines 110 may then be formed in the line material layer. Forming the plurality of material lines 110 may be formed using a lithography-etch process, e.g., a single lithography-etch process. When using a single lithography-etch process is used, the material lines 110 with a line width and a line spacing corresponding to the resolution of the lithographic process may thereby be formed. For example, the material lines 110 may have a line width and a line spacing having dimensions that are about equal or greater than the wavelength of the light used for the lithography process. However, embodiments are not so limited and in other embodiments, the plurality of material lines 110 may also be formed in a multiple patterning process. In these embodiments, the material lines 110 with a line width and a line spacing with sub-lithographic dimensions may thereby be formed. Examples of multiple-patterning techniques include (litho-etch)$^x$, where the superscript indicates the number of lithography and etch processes that are used to form the material lines 110. Examples of multiple-patterning techniques also include pitch splitting techniques such as self-aligned double patterning (SADP) or quadruple patterning (SAQP). Such techniques may be adapted to various embodiments disclosed herein by the skilled person and will therefore not be described in detail herein.

With reference to FIG. 1c, a sacrificial material layer 116 formed a of sacrificial material has been formed to fill the gaps 114 and to cover the material lines 110. Examples of the sacrificial material include an oxide material, an amorphous carbon (a-C) material, an amorphous silicon (a-Si) material, a spin-on carbon (SOC) material or a spin-on oxide dielectric (SOD), to name a few. The sacrificial material is selected to be different from the material lines 110 and of the mask layer 108 to allow selective removal of the sacrificial material from the mask layer 108 and the material lines 110. The sacrificial material layer 116 may be deposited using a suitable technique, e.g., an ALD process, for instance a plasma-enhanced-ALD (PEALD) process, CVD, electron-beam evaporation or sputtering (PVD), to name a few.

Depending on the type of sacrificial material and the deposition process, a planarization of the sacrificial material layer 110 may be performed, for instance by chemical mechanical polishing (CMP). As indicated by the dashed line h, in some embodiments, a thickness of the sacrificial material layer 116 may optionally be reduced by CMP such that the top surfaces of the material lines 110 are exposed.

However, embodiments are not so limited and in the following description, embodiments in which a thickness reduction, if performed, stops before the material lines 110 are exposed. Accordingly, the sacrificial material layer 116 includes an upper thickness portion arranged above the material lines 110 and a lower thickness portion arranged within the gaps 114.

With reference to FIG. 1d, a hole 118 has been formed by removing the sacrificial material 116 along a portion of the gap 114a. For illustrative purposes only, in FIG. 1d, a section of the sacrificial material layer 116 has been removed to allow a view of the hole 118. The hole 118 extends across the gap 114a and exposes the mask layer 108, more specifically a portion 108a of the mask layer 108. In the illustrated embodiment, the hole 118 is formed by etching completely through the sacrificial material 116. Thus, the mask layer portion 108a forms a bottom surface of the hole 118. In the illustrated embodiment, the hole 118 is formed using a mask layer having a corresponding hole having a dimension, e.g., the width in the direction perpendicular to the extension direction of the material lines 110, that is greater than the width of the gap 114a, such that the hole 118 exposes a side wall portion of the material line 110a and a side wall portion of the material line 110b. It will be appreciated that, because of the etch selectivity between the sacrificial material layer 116 and the material lines 110, the resulting hole 118 has a width in the direction perpendicular to the extension direction of the material lines 110 that is defined by the width of the 114a.

The hole 118 includes an upper hole portion extending through the upper thickness portion of the sacrificial material layer 116. The hole 118 includes a lower hole portion extending through the lower thickness portion of the sacrificial material layer 116, i.e., inside the gap 114a. An opening or mouth of the hole 118 is arranged at the top surface of the sacrificial material layer 116. The mouth of the hole 118 is hence arranged at a level above the top surface of the material lines 110.

As shown in FIG. 1d, a plurality of holes may also be formed, including for instance holes 119 and 120. The hole 119 is formed along the same gap 114a as the hole 118, however at a different longitudinal position along the gap 114a. The hole 120 is formed along a different gap 114b than the hole 118. The above description of the hole 118 otherwise applies correspondingly to the holes 119, 120 otherwise. It is noted that the number of holes shown in figures merely represent an example and that the method generally may include forming of any number of holes, however at least one hole.

The holes 118, 119, 120 may be formed by depositing a lithographic layer stack on the sacrificial material layer 116. The layer stack may be a suitable lithographic stack arranged to allow formation of holes with dimensions corresponding to the critical dimensions of the material lines 110. As a non-limiting example, a layer stack may include, in a bottom up direction, a spin-on-carbon (SOC) layer, a spin-on-glass (SOG) layer and a photo-resist layer. Holes may be patterned in the photo-resist layer in a lithographic process, which may be transferred into the layer stack and into the sacrificial material layer 116. A number of lithographic and etch steps may be performed to facilitate forming of a plurality of holes. A dry etching process may be used for etching the holes 118, 119, 120. The etching process may be of any type allowing etching of the sacrificial material, selectively from the material of the mask layer 108, and preferably also from the material of the material lines 110.

In FIG. 1d, the holes 118, 119, 120 extend across only a single gap 114. However, embodiments are not so limited and it is also possible to form a hole with a greater width such that a single gap covers more than one gap, such as two or three consecutive gaps 114. As may be understood from the following, this enables simultaneous forming of two or more block portions, at corresponding longitudinal positions within two or more gaps.

With reference to FIG. 1e, a fill material layer 122 of fill material has been formed to fill the holes 118, 119, 120 and cover the sacrificial material. The fill material may be of any of the materials mentioned in connection with the material lines 110. The fill material may be selected to be of a same material as the material lines 110, or of a different material than the material lines 110. Whether or not the fill material may be the same or different from the material of the material lines 110, the fill material and the material lines 110 are formed of materials that can be selectively etched with respect to the sacrificial material layer 116. The fill material layer 122 may be deposited using a deposition process suitable for the selected material. Examples of deposition processes include CVD, PVD, ALD and spin-coating.

The fill material layer 122 includes an upper thickness portion arranged above a mouth of each hole 118, 119, 120 and a lower thickness portion arranged within each hole 118, 119, 120. The lower thickness portion in each hole 118, 119, 120 form a respective block portion 124, 125, 126 of fill material, as shown in FIG. 1f.

With reference to FIG. 1f, a thickness of the fill material layer 122 has been reduced to remove the upper thickness portion of the fill material layer 122 and thereby expose the mouths of the holes 118, 119, 120. For illustrative purposes only, a section of the sacrificial material layer 116 has been removed to allow a view of the block portion 124. The block portions 124, 125, 126, which previously were connected via the upper thickness portion of the fill material layer 122, thereby become discrete block portions 124, 125, 126, or connecting or bridging portions that connect adjacent material lines 110. In some embodiments, the block or connecting portions 124, 125, 126 may be formed periodically in a lateral direction, e.g., the direction parallel to the extension direction of the material lines 110.

The thickness reduction may be achieved by applying CMP to the top surface of the fill material layer 122 and/or performing an etch back in a dry etching process, for instance a plasma-based reactive ion etch (RIE).

The thickness reduction may be stopped directly when the mouths of the holes 118, 119, 120 or the top surface of the sacrificial material layer 116 are exposed. However, it is also possible to continue the thickness reduction after exposing the structures, thereby reducing a thickness/height of the block portions 124, 125, 126. Advantageously, the thickness reduction should however be stopped at the latest when exposing the top surfaces of the material lines 110.

In case the thickness of the sacrificial material layer 116 as described in connection with FIG. 1c has been reduced to the level h, it follows that the thickness reduction of the fill material layer 122 will expose the mouths of the holes 118, 119, 120 at a same time as the top surfaces of the material lines 110.

With reference to FIG. 1g, the sacrificial material 116 has been removed, selectively to the material lines 110 and the block portions 124, 125, 126. The gaps 114, in particular the portions of the mask layer 108 in the gaps 114, have thereby been exposed.

The sacrificial material 116 may be removed by wet etching or dry etching. The etching chemistry may be adapted to etch the sacrificial material 116 with a first etch rate and the material of the material lines 110 and the block portions 124, 125, 126 with a second etch rate, the second etch rate being lower than the first etch rate. Etching chemistries allowing selective removal of for instance an oxide sacrificial material 116 from for instance nitride-based materials are a buffered hydro fluoric acid (bHF) etch or a diluted HF (dHF). Other possible etching processes include a fluorine-based plasma RIE or remote plasma assisted dry etch processes. It may be noted that the removal of the sacrificial material 116, although being selective, still may etch the material lines 110 and the block portions 124, 125, 126 to some extent. However, by an appropriate selection of the etching process and the materials (of the material lines 110, the block portion 124, 125, 126 and the sacrificial material 116), the sacrificial material 116 may be removed while preserving the material lines 110 and the block portions 124, 125, 126 to an extent such that the material lines 110 and the block portion 124, 125, 126 may act as an etch mask during a subsequent pattern transfer into the mask layer 108, described below.

As shown in FIG. 1g, the gap 114a is interrupted in the longitudinal direction by the block portion 124 that connect adjacent ones of the material lines 110. The block portion 124 is arranged in abutment with the material line 110a and the material line 110b. The block portion 124 extends across the gap 114a, transverse to the longitudinal direction of the gap. The block portion 124 hence bridges the gap 114a and connects the material line 110a and the material line 110b. A further longitudinal interruption of the gap 114a is formed by the block portion 125. The gap 114b is interrupted by, among others, the block portion 126. Thus, the resulting combination of the material lines 110 and the block portions (or the connecting or bridging portions) form a pattern that includes segments of a gap or a trench having lengths that are defined by a pair of the block portions.

With reference to FIG. 1h, the pattern defined by the material lines 110 and the block portions 124, 125, 126 has been transferred into the mask layer 108. The mask layer 108 has been etched while using the material lines 110 and the block portions 124, 125, 126 as a combined etch mask. A wet etching process with etching chemistry of $HNO_3$ or bHF may be used for etching the mask layer 108. A dry etching process with $CHF_3$, $CF_4$ or $Cl_2$ based plasmas may be used for etching of the mask layer 108. Thus, the combination of the material lines 110 and the block portions 124, 125, 126 form a template for patterning the mask layer 108. In some embodiments, thus patterned mask layer 108 may in turn form a template for patterning the underlying target layer 106.

As shown in FIG. 1h, the mask layer 108 has accordingly been patterned to include trenches 128, 128a, 128b. As described above, some of the trenches 128a, 128b are interrupted at the longitudinal positions of the block portions 124, 125. Corresponding, the trench 128b is interrupted at the longitudinal position of the block portion 126. The trenches 128a, 128b hence form interrupted or discontinuous trenches.

As indicated by the dashed lines in the dielectric layer 106 in FIG. 1h, the trenches 128 may further be transferred into the dielectric layer 106. The pattern transfer may be performed by an anisotropic etch process. The etch process may be a plasma-based etching process. The etch process may be a reactive ion etching (RIE) process. For instance, F-based plasmas may be used for selectively etching a silicon oxide-based dielectric layer 106 with respect to a mask layer 108 of for instance titanium nitride, titanium oxide, hafnium oxide or zirconium oxide.

Following the pattern transfer into the dielectric layer 108, the mask layer 108 may be removed. The mask layer 108 may be removed for instance using a same etching process as mentioned in connection with the pattern transfer into the mask layer 108. Additionally, the material lines 110 and the block 124, 125, 126 may be removed.

The trenches in the dielectric layer 106 may subsequently be filled with a conductive material to form the conductive paths or lines of the metallization level. The conductive material may be a single metal such as Cu, Al or W, or alloys thereof.

The trenches 134 may be filled with a conductive material using an electro-plating process, a damascene process or a deposition process such as CVD or ALD.

The conductive material may be formed to overfill the trenches and thus cover the top surface of the dielectric layer 106. Such excess material may subsequently be removed by CMP and/or etch back to form the final conductive paths.

The above method steps may be supplemented with conventional process techniques for via formation, in order to interconnect conducting paths of different metallization levels. Such processes are per se known to the skilled person and will therefore not be further detailed herein.

Figure 2A:
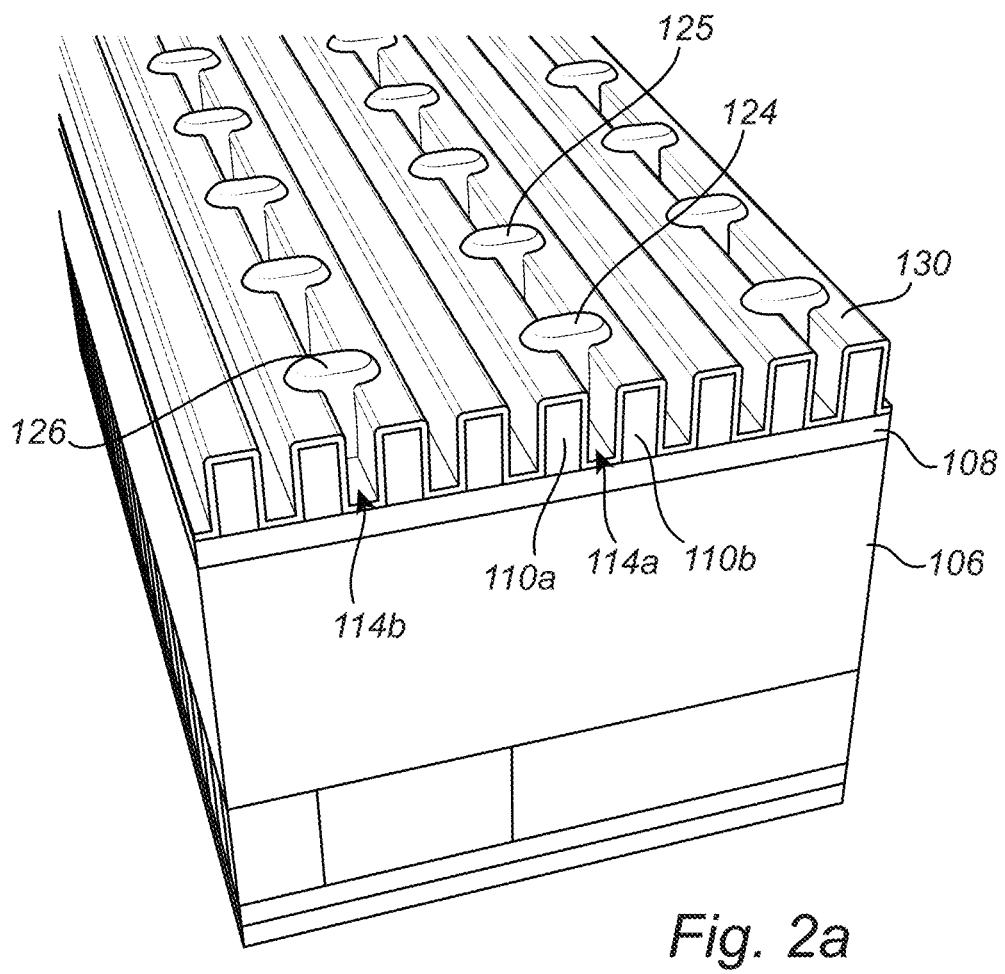
FIGS. 2a-2b schematically illustrate optional additional process steps of the method illustrated in FIGS. 1a-1h.
Figure 2B:
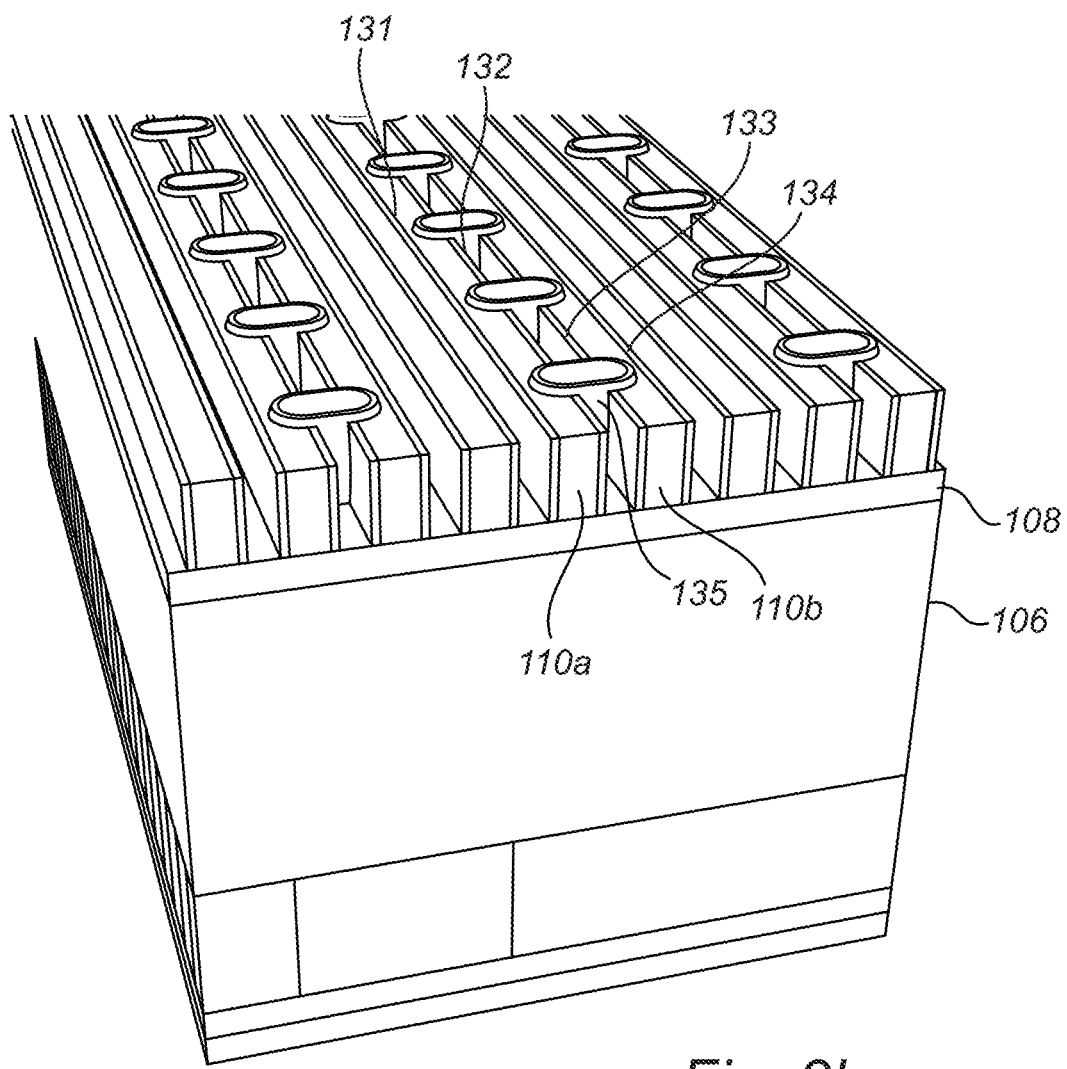

FIGS. 2a and 2b schematically illustrate optional additional process steps which may be incorporated in the method flow.

Subsequent to removing the sacrificial material 116 and prior to transferring a pattern into the mask layer 108 (i.e., at the stage illustrated in FIG. 1g), a conformal layer 130 may be formed to cover the mask layer 108, the material lines 110 and the block portions 124, 125, 126. The conformal layer 130 forms a thin film covering the mask layer 108 in the gaps 114, the side walls and top surfaces of the material lines 110 and side walls and top surfaces of the block portions 124, 125, 126. The conformal layer 130 may be formed by depositing an oxide in an ALD process. The conformal layer 130 may alternatively be formed by an ALD nitride.

With reference to FIG. 2b, the conformal layer 130 may be etched anisotropically, in the vertical direction, such that the mask layer 108 is exposed in the gaps 114 while conformal layer portions remain on the side walls of the material lines 110 and on the block portions 124, 125, 125. As shown in FIG. 2b, the side walls of the material line 110a are provided with conformal layer portions 131, 132. The side walls of the material line 110b are provided with conformal layer portions 133, 134. The side walls of the block portion 124 is provided with conformal layer portion 135. The conformal layer portions 131, 132, 133, 134 form side wall spacer-like features on the material lines 110 and allow a gap width to be reduced, or restored in case earlier processing steps have caused material loss from the material lines 110.

Subsequent to the anisotropic etch, the method may proceed as discussed in connection with FIG. 1h.

In the above the inventive concept has mainly been described with reference to a limited number of examples. However, as is readily appreciated by a person skilled in the art, other examples than the ones disclosed above are equally possible within the scope of the inventive concept, as defined by the appended claims.

What is claimed is:
1. A method of patterning a target layer, the method comprising:
   forming on the target layer a plurality of parallel material lines spaced apart such that longitudinal gaps exposing the target layer are formed between the material lines;
   filling the gaps with a sacrificial material;
   forming a hole by removing the sacrificial material along a portion of one of the gaps, the hole extending across the gap and exposing the target layer in the gap;
   filling the hole with a fill material to form a block portion extending across the gap;
   removing, selectively to the material lines and the block portion, the sacrificial material from the target layer to expose the gaps, the one of the gaps being interrupted in the longitudinal direction by the block portion; and
   transferring a pattern including the material lines and the block portion into the target layer.

2. The method according to claim 1, wherein filling the gaps with the sacrificial material includes forming a sacrificial material layer that fills the gaps and covers the material lines.

3. The method according to claim 2, wherein the sacrificial material layer includes an upper thickness portion arranged above the material lines and a lower thickness portion arranged within the gaps, wherein the hole includes an upper hole portion extending through the upper thickness portion and a lower hole portion extending through the lower thickness portion.

4. The method according to claim 2, further comprising reducing a thickness of the sacrificial material layer to expose a top surface of the material lines, prior to forming the hole.

5. The method according to claim 1, wherein filling the hole with the fill material includes forming a fill material layer that fills the hole and covers the sacrificial material.

6. The method according to claim 5, wherein the fill material layer includes an upper thickness portion arranged above a mouth of the hole and a lower thickness portion arranged within the hole, the method further comprising reducing a thickness of the fill material layer to remove the upper thickness portion of the fill material layer.

7. The method according to claim 1, further comprising forming at least a second hole by removing the sacrificial material along a portion of a second one of the gaps, the second hole extending across the second gap and exposing the target layer in the second gap.

8. The method according to claim 7, further comprising forming a fill material layer filling the hole and the second hole and covering the sacrificial material, wherein the block portion is formed in the hole and a second block portion is formed in the second hole.

9. The method according to claim 8, wherein the fill material layer includes an upper thickness portion arranged above a mouth of each of the hole and the second hole, and a lower thickness portion arranged within the hole and the second hole, the method further comprising reducing a thickness of the fill material layer to remove the upper thickness portion of the fill material layer, wherein the block portion and the second block portion form discrete block portions.

10. The method according to claim 1, further comprising, subsequent to removing the sacrificial material and prior to transferring a pattern into the target layer:
  forming a conformal layer covering the mask layer, the material lines and the block portion; and
  etching the conformal layer anisotropically such that the target layer is exposed in the gaps and portions of the conformal layer remain on side walls of the material lines and the block portion.

11. The method according to claim 1, wherein the target layer forms a mask layer arranged on a dielectric layer, the method further comprising transferring a pattern of the mask layer into the dielectric layer.

12. The method according to claim 1, wherein the sacrificial material is different from the fill material and a material of the material lines.

13. The method according to claim 1, wherein a material of the material lines and the fill material are the same.

14. The method according to claim 1, wherein a material of the target layer is different from a material of the material lines.

15. A method of forming conducting segments, the method comprising:
  forming on a semiconductor substrate a blanket layer of inter-metal dielectric material;
  forming on the blanket layer of the inter-metal dielectric material a template pattern for forming the conductive segments, wherein forming the template pattern comprises:
    forming a plurality of template lines extending in a first direction in a first patterning process,
    bridging portions of adjacent template lines separated by a trench with connecting portions in a second patterning process, thereby forming a pattern of locally bridged template lines, and
    forming one or more trench segments extending in the first direction in the blanket layer of the inter-metal dielectric material using the pattern of locally bridged template lines as an etch mask; and
  filling the one or more trench segments with a conducting material to form the conducting segments.

16. The method according to claim 15, wherein bridging portions of the adjacent template lines comprises:
  filling the trench between the adjacent template lines with a sacrificial material;
  forming a patterning layer over the trench, the patterning layer comprising holes laterally extending across the trench between the adjacent template lines;
  selectively etching the sacrificial material against the template lines to form holes in the sacrificial material, the holes extending through the sacrificial material; and
  filling the holes formed in the sacrificial material with a bridging material to form the bridging portions.

17. The method according to claim 16, further comprising selectively removing the sacrificial material against the template lines and the bridging portions, thereby forming the pattern of locally bridged template lines.

18. The method according to claim 17, wherein the holes formed in the patterning layers have a lateral dimension in a second direction crossing the first direction that is greater than the width of the trench, while the lateral dimension of the holes formed in the sacrificial material in the second direction is defined by the width of the trench.

* * * * *